United States Patent [19]

Shimizu et al.

[11] Patent Number: 5,364,731
[45] Date of Patent: Nov. 15, 1994

[54] MULTI-COLOR TRANSFER IMAGE FORMING METHOD TO FORM COLOR PROOFS

[75] Inventors: Kunio Shimizu; Nobumasa Sasa; Manabu Watanabe, all of Hino; Hiroshi Ide, Sagamihara; Shinya Mayama, Yokohama, all of Japan

[73] Assignees: Konica Corporation; Mitsubishi Kasei Corporation, both of Tokyo, Japan

[21] Appl. No.: 140,897

[22] Filed: Oct. 25, 1993

Related U.S. Application Data

[63] Continuation of Ser. No. 759,654, Sep. 13, 1991, abandoned, which is a continuation of Ser. No. 481,728, Feb. 16, 1990, abandoned, which is a continuation of Ser. No. 395,144, Aug. 16, 1989, abandoned, which is a continuation of Ser. No. 150,022, Jan. 29, 1988, abandoned.

[30] Foreign Application Priority Data

Jan. 30, 1987 [JP] Japan ................. 62-19715
Dec. 8, 1987 [JP] Japan ................. 62-309981

[51] Int. Cl.$^5$ .................................. G03C 7/00
[52] U.S. Cl. ..................... 430/143; 430/257; 430/293
[58] Field of Search ................ 430/143, 257, 293

[56] References Cited

U.S. PATENT DOCUMENTS

| | | |
|---|---|---|
| 3,136,637 | 6/1964 | Larson . |
| 3,671,236 | 6/1972 | Van Beusckom .............. 430/293 |
| 3,682,635 | 8/1972 | Van Besauw et al. ......... 430/143 |
| 3,721,557 | 3/1973 | Inoue ............................ 430/143 |
| 3,764,318 | 8/1973 | Laridon . |
| 3,775,113 | 11/1973 | Bonham et al. . |
| 3,904,411 | 9/1975 | Ericson et al. .............. 430/257 |
| 4,053,313 | 10/1977 | Fan ............................. 430/291 |
| 4,260,673 | 4/1981 | Krech ......................... 430/143 |
| 4,304,836 | 12/1981 | Cheema et al. .............. 430/252 |
| 4,389,473 | 1/1983 | Scrutton et al. ............. 430/143 |
| 4,571,374 | 2/1986 | Vikesland .................... 430/143 |
| 4,596,757 | 6/1986 | Barton et al. ............... 430/257 |
| 4,656,114 | 4/1987 | Cederburg et al. .......... 430/143 |
| 4,762,766 | 8/1988 | Melbye ....................... 430/143 |
| 4,808,508 | 2/1989 | Platzer ........................ 430/143 |

FOREIGN PATENT DOCUMENTS 0115899 8/1984 European Pat. Off. .
47-41830 12/1972 Japan .

*Primary Examiner*—Charles L. Bowers, Jr.
*Assistant Examiner*—Chrisopher G. Young
*Attorney, Agent, or Firm*—Finnegan, Henderson, Farabow, Garrett & Dunner

[57] ABSTRACT

Disclosed is a multi-color transfer image forming method, which comprises subjecting a colored image forming material having a coloration recording layer comprising at least two layers and containing a photosensitive material and a colorant on a support to aqueous development after imagewise exposure, thereby forming a colored image, transferring the colored image to an image receiving member through the outermost surface of the coloration recording layer and then transferring at least one colored image with different hue onto the same image receiving member in conformity with the colored image, characterized in that the layer of the coloration recording layer remotest from the support is a layer adherable to the image receiving member, and only the colored image portion is transferred onto the image receiving member to have the image receiving member surface exposed at the non-image portion of the multi-color image.

According to the present invention, the treating process of multi-color transfer image becomes simpler and also a transferred image approximate to a printed matter can be obtained.

22 Claims, 1 Drawing Sheet

MULTI-COLOR TRANSFER IMAGE FORMING METHOD TO FORM COLOR PROOFS

This application is a continuation of application Ser. No. 07/759,654 filed Sep. 13, 1991, now abandoned, which is a continuation of application Ser. No. 07/481,728 filed Feb. 16, 1990, abandoned, which is a continuation of application Ser. No. 07/395,144 filed Aug. 16, 1989, abandoned, which is a continuation of application Ser. No. 07/150,022 filed Jan. 29, 1988, abandoned.

BACKGROUND OF THE INVENTION

This invention relates to a multi-color transfer image forming method to be used for formation of color proof, etc.

In carrying out color printing, in either of lithography, letter press or gravure, the half tone method is used, and color-resolved dots, positive or negative plate is required.

For saving of labor and time for proofreading performed prior to such practical printing, a color sheet for proofreading, namely color proof, has been generally known.

Concerning layer constitution and image forming method for such color proof, various proposals have been made. Typical transfer system of color proof are (1) the method in which a colored image is formed by transferring a photosensitive layer containing a colorant onto a support and repeating exposure and developing; (2) the method in which a photosensitive tacky layer is laminated onto a support and a toner is applied after exposure; and (3) the method in which monochromatic images formed on a color sheet are successively transferred onto an image receiving layer, and retransferred onto an image receiving member.

However, the above respective methods are complicated in process and require enormous labors. Also, particularly the colored image layer transferred, partly because it takes the form embedded in the receiving layer in the method of (3), had luster not only on the surface of the transferred image but also on the non-image portion, and therefore gave a feeling of quality or image quality different from practical printed matter. Accordingly, in order to make the image quality approximate to that of practical printed matter as possible, the transferred image surface is required to be subjected to matting treatment, and even if such treatment may be effected, the feeling of quality given was different from that of practical printed matter.

SUMMARY OF THE INVENTION

Therefore, a primary object of the present invention is to provide a method for forming a transferred image, which is not only simple in the treatment process, but also can form a color proof approximate in quality feeling to practical printed matter.

The above object can be accomplished by a multi-color transfer image forming method, which comprises subjecting a colored image forming material having a coloration recording layer comprising at least two layers and containing a photosensitive material and a colorant on a support to aqueous development after imagewise exposure, thereby forming a colored image, transferring the colored image to an image receiving member through the outermost surface of the coloration recording layer and then transferring at least one colored image with different hue onto the same image receiving member in conformity with said colored image, characterized in that the layer of said coloration recording layer remotest from the support is a layer adherable to the image receiving member, and only the colored image portion is transferred onto the image receiving member to have the image receiving member surface exposed at the non-image portion of said multi-color image.

In the present invention, when a colored image is formed, the outermost layer of the colored image forming material has a layer adherable to an image receiving member, namely an adhesive layer, and therefore, when, for example, heat transfer is effected after superposing the adhesive layer onto the image receiving member, a photosensitive composition layer is exposed directly under the naked state on the outermost layer of the color proof finally obtained. Therefore, the outermost surface of the photosensitive composition layer has no lustre and give a quality feeling approximate to practical printed matter.

DESCRIPTION OF THE PREFERRED EMBODIMENTS

The present invention is described in more detail below.

Figure 1:
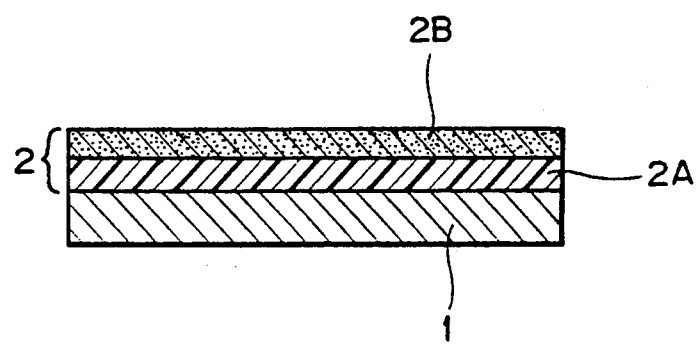
FIG. 1 is a perspective view of an example of layer constitution of a photographic image forming material.
Figure 2:
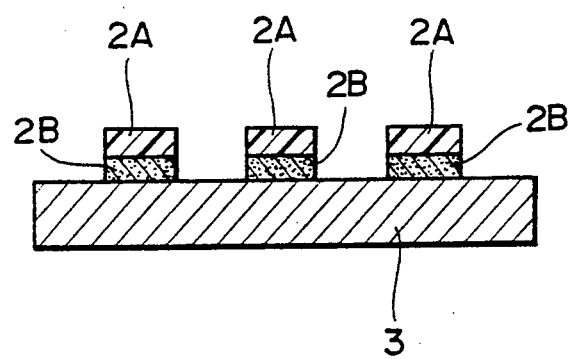
FIG. 2 is a perspective view of a color proof finally obtained.

First, the process of the present invention is outlined by referring to FIG. 1 and FIG. 2.

FIG. 1 illustrates the layer constitution of a photosensitive image forming material, having a coloration recording layer 2 through a mold release treated layer or a subbing layer or directly without any such layer on a transparent support 1 such as of polyester, etc. The coloration recording layer 2 comprises at least two layers 2A and 2B, and the layer 2B remotest from the support 1 is made of an adhesive layer. The adhesive layer 2B may be one which can be adhered when the colored image is transferred onto an image receiving member, including in addition to those which can exhibit adhesiveness at room temperature under no treatment, those which can exhibit adhesiveness under some treatment, for example, by giving heat, and also those which can exhibit adhesiveness by activation of the surface by wetting with a solvent, etc. capable of swelling adequately the layer. Preferably, those having thermal fusibility may be employed.

The coloration recording layer 2 contains at least a photosensitive material and a colorant.

As the embodiment of the coloration recording layer 2, the present invention includes various embodiments as described below, but in the embodiment shown in the Figure, the lower layer 2A is the colorant-photosensitive layer containing a colorant and a photosensitive material, and the upper layer 2B is a binder layer exhibiting thermal fusibility.

On such photosensitive image forming material, on the side of the transparent support 1, or on the side of the binder layer 2 if the binder layer 2 is transparent, imagewise exposure is effected. Then, aqueous developing is performed to form a colored image.

Subsequently, with the outermost surface of the photosensitive image forming material having the colored image formed thereon, namely the binder layer 2, being superposed on an image receiving member 3, preferably a paper for printing, heat is given to effect thermal fusion of the binder layer 2, followed by peel-off of the transparent support 1 to effect transfer, thus forming a transferred image on the image receiving member 3 as shown in FIG. 2.

In this invention, the coloration recording layer comprising at least two layers is completely transferred to the image receiving member when the transfer is made.

The embodiments of the coloration recording layer in the present invention are as shown in Table 1.

TABLE 1

| Embodiment No. | Upper layer | Lower layer |
|---|---|---|
| 1 | Binder | Colorant - photosensitive |
| 2 | Colorant | Photosensitive |
| 3 | " | Colorant - photosensitive |
| 4 | Photosensitive | Colorant |
| 5 | " | Colorant - photosensitive |
| 6 | Colorant, photosensitive | Binder |
| 7 | Colorant, photosensitive | Colorant |
| 8 | Colorant, photosensitive | Photosensitive |
| 9 | Colorant, photosensitive | Colorant - photosensitive |

Also, between the lower layer in Table 1 and the support, other than the mold release treated layer or the subbing layer, various layers shown as the lower layer constitution in Table 1 may be further formed. An example of such constitution may be the case of Embodiment No. 4 in which the upper layer is made a photosensitive layer, the lower layer is made a colorant layer and further, between the lower layer and a support, a colorant-photosensitive layer, etc. is provided.

The above colorant layer means a layer containing a colorant such as pigment or dye, the colorant-photosensitive layer means a layer containing both of a colorant and a photosensitive material, and the binder layer means a layer containing none of colorant and photosensitive material. Further, the photosensitive layer is a layer containing no colorant but containing a photosensitive material. In this case, since the colorant layer of the upper layer must have the adhesion function and only a colorant cannot have such adhesion function, it contains some adhesion functional substance. As to the photosensitive layer of the upper layer, in addition to the case when the photosensitive material itself has the adhesion function, an adhesion functional substance other than the photosensitive material may be sometimes added. Further, similarly for the colorant-photosensitive layer of the upper layer, an adhesion functional substance may be also added.

As the support for the photosensitive image forming material to be used in the present invention, a polyester film, particularly a biaxially stretched polyethylene-terephthalate film is preferred with respect to dimensional stability to water and heat, but acetate film, polyvinyl chloride film, polystyrene film, polypropylene may be also available. Further, although these supports may be also used as such, mold release treatment with an appropriate oil repellent substance may be applied or a subbing layer may be provided for improving transferability of the image after image formation.

As the oil repellent substance, there may be included, for example, silicone resin, fluorine resin and fluorine type surfactant, polyolefin, polyamide; while as the subbing layer, there may be employed, for example, those having weak adhesive force with the transparent support such as alcohol-soluble polyamide, alcohol-soluble nylon, a blend of a partially esterified resin of a copolymer of styrene and maleic anhydride with a methoxymethylated nylon, polyvinyl acetate, polyacrylate, copolymer of polymethyl methacrylate and acrylate, polyvinyl chloride, copolymer of vinyl chloride and vinyl acetate, polyvinyl butyrate, cellulose acetate phthalate, methyl cellulose, ethyl cellulose, cellulose diacetate, cellulose triacetate, polyvinyl alcohol.

For enhancing mold releasability, among the above examples, particularly preferred are examples in which a polypropylene layer and/or a polyethylene layer is provided desirably in a thickness thicker than that of the support.

As the method for providing a polypropylene layer or a polyethylene layer on a support, there may be included 1) the so-called dry lamination method in which a solution of polyvinyl acetate, polyvinyl chloride, epoxy resin, polyurethane type resin, natural rubber or synthetic rubber dissolved in an organic solvent is used as the adhesive, and after these adhesives are applied on the support and dried by hot blow or heating, a polypropylene film or a polyethylene film is superposed and pressure adhered under heating to effect lamination; 2) the so-called hot melt lamination method in which a mixture of a copolymer of ethylene and vinyl acetate or ethylene and an acrylic acid ester, polyamide resin, petroleum resin, rosins, waxes are used as the adhesive, and these adhesives are heated as such and while maintaining the molten state, applied on the support by the doctor blade method, the roll coating method, the gravure method, the reverse roll method, etc., followed immediately by plastering of a polypropylene film or a polyethylene film, and heated to a high temperature, if necessary, before cooling to effect lamination; 3) the so-called extrusion lamination method in which polypropylene or polyethylene is maintained under molten state, extruded into a film through an extruder, and pressure adhered onto the support while this is under molten state to effect lamination; 4) and the so-called co-extrusion method in which a plurality of extruders were used in molding of a film which becomes the support by melt extrusion method, and a polypropylene layer or a polyethylene layer is formed on the support film by molding at one time together with polypropylene or polyethylene under molten state; etc.

The above support may be either transparent or opaque. When the above upper layer is opaque, the support is made transparent and imagewise exposure is requried to be effected from the support side, while if the upper layer is transparent, imagewise exposure can be effected on the side of the upper layer.

As the photosensitive composition for the photosensitive material to be used in the present invention, various materials have been known in the art, and commercial products are readily available. Useful photosensitive compositions may include all of the compounds such as monomers, prepolymers and polymers which can undergo chemical changes in molecular structure within a short time when receiving irradiation of active rays, to be changed in solubility relative to solvents, thereby permitting the exposed portion or the non-exposed portion to be dissolved away when a certain kind of solvent is applied. Examples of available photosensitive compositions may include, as the so-called nega-posi type, photocrosslinkable type photosensitive resin system, typically a polyvinyl alcohol esterified with cinnamic acid, a system comprising a mixture of a diazonium salt or its condensate with polyvinyl alcohol, polyvinyl pyrrolidone, polyacrylamide, etc., or a system in which an aromatic azide compound is used as the photocrosslinkable agent and mixed with a binder such as cyclized rubber, etc., and further a photosensitive resin utilizing photoradical polymerization or photoionic polymerization. Also, as the posi-posi type in which solubility at the exposed portion is increased, a photosolubilizing type resin system, typically a combination of naphthoquinonediazide and a novolac resin may be employed.

Commercial products of such photosensitive compositions may include "KPR", "KOR" and "KMEK" produced by Eastman Kodak Co., U.S.A.; "AZ-340", "AZ-119" and "AZ-1350" produced by Sippley Co., U.S.A.; "TPR" and "Oka Resist" produced by Tokyo Oka; "FPPR" produced by Fuji Yakuhin, and all of these can be utilized.

Otherwise, it is also possible to use a photosolubilizing type resin system containing a compound capable of generating an acid by irradiation of active rays and a compound having at least one bond decomposable with an acid.

As the photosensitive composition, quinonediazide compounds are useful.

Specifically, there may be preferably employed compounds obtained by condensation of 1,2-benzoquinonediazide-4-sulfonyl chloride, 1,2-naphthoquinonediazide-4-sulfonyl chloride, 1,2-naphthoquinonediazide-6-sulfonyl chloride, or 1,2-naphthoquinonediazide-6-sulfonyl chloride with hydroxyl group- and/or amino group-containing compounds.

Examples of the hydroxyl group-containing compound may include trihydroxybenzopheone, dihydroxyanthraquinone, bisphenol A, phenol novolac resin, resorcin benzaldehyde condensed resin, pyrogallol acetone condensed resin, etc. Examples of the amino group-containing compound may include, for example, aniline, p-aminodiphenylamine, p-aminobenzophenone, 4,4'-diaminodiphenylamine, 4,4-diaminobenzophenone, etc.

Including those written here, concerning quinonediazide compounds, further the descriptions in J. KOSAR, "Light Sensitive System" (Wiley & Sons, New York, 1965) and Nagamatsu and Inui, "Photosensitive Polymers" (Kodansha, 1977) may be followed.

As the coloring substance as the colorant to be used in the present invention, dyes and pigments can be used. Particularly, when used for color correction, pigments and dyes with tones in conformity with the normal colors required there, namely yellow, magenta, cyan and black are required, and otherwise metal powder, white pigment, fluorescent pigment, etc. can be also used. The following examples are some examples of a large number of pigments and dyes known in this field of the art (C.I means color index):

Victoria Pure Blue (C.I 42595)
Auramine O (C.I 41000)
Catilon Brilliant Flavin (C.I basic 13)
Rhodamine GGCP (C.I 45160)
Rhodamine B(C.I 45170)
Safranine OK70:100 (C.I 50240)
Eliograucin X (C.I 42080)
Fast Black HB (C.I 26150)
No. 1201 Lionol Yellow (C.I 21090)
Lionol Yellow GRO (C.I 21090)
Simlar Fast yellow 8GF (C.I 21105)
Benzidine Yellow 4T-564D (C.I 21095)
Simlar Fast Red 4015 (C.I 12355)
Lionol Red 7B4401 (C.I 15830)
Fastgen Blue TGR-L (C.I 74160)
Lionol Blue SM (C.I 26150)
Mitsubishi Carbon Black MA-100
Mitsubishi Carbon Black #30, #40, #50

The content of the coloring substance can be determined by the method known to those skilled in the art in view of the optical density aimed at and eliminability relative to the developer. For exmple, in the case of a dye, its content may be suitably 5% to 75% by weight based on a composition of a layer containing the dye, while in the case of a pigment, its content may be suitably 5% to 90% by weight based on a composition of a layer containing the pigment.

The photosensitive material and the colorant as described above have no or poor film forming property, and therefore it is preferable to effect film formation by use of a binder.

As the binder, there can be used polymeric compounds which can form a film and is soluble in a solvent, and can be dissolved or swelled in the developer.

Specific examples of the polymeric compound suitably used in the above coloration recording may include acrylic acid or methacrylic acid and alkyl ester or sulfoalkylester thereof, phenol resin, polyvinyl butyral, polyacrylamide, cellulose derivatives such as ethyl cellulose, cellulose acetate-butyrate, cellulose acetate propionate, cellulose acetate, benzyl cellulose, cellulose propionate, etc., otherwise polystyrene, polyvinyl chloride, chlorinated rubber, polyisobutylene, polybutadiene, polyvinyl acetate, and their copolymers, cellulose acetate, cellulose propionate, cellulose acetate phthalate, etc.

The binder can be used as such in the binder layer shown in the above Table, or as the binder in the colorant layer, the photosensitive layer and the colorant-photosensitive layer.

Also, as the binder to be used for constitution of the upper layer shown in Table 1 or for constitution of the upper layer together with the colorant or the photosensitive material, there may be desirably used (1) a novolac resin, particularly a phenol resin having a weight average molecular weight (Mw) of 3,500 to 500 and a number averave molecular weight (Mn) of 1,000 to 200, and (2) a copolymer containing at least one of phenolic hydroxyl group, alcoholic hydroxyl group, carboxylic group for transferability of the colored image onto the image receiving member, particularly thermal fusibility.

The novolac resin of the above (1) is inclusive of all compounds having at least one hydrogen atom bonded to an aromatic ring substituted with hyroxyl group, and specifically there can be mentioned, for example, phenol, o-cresol, m-cresol, p-cresol, 3,5-xylenol, 2,4-xylenol, 2,5-xylenol, carvacrol, thymol, catechol, resorcin, hydroquinone, pyrogallol, fluoroglycine, alkyl (having 1 to 8 carbon atoms)-substituted phenol, etc. There may be suitably used novolac type resins obtained by polycondensation between such type of phenols and active carbonyl compounds.

Such active carbonyl compounds may include, for example, aldehydes and ketones, specifically formaldehyde, acetaldehyde, benzaldehyde, acrolein, furfural, acetone, etc.

The polycondensed resin obtained may include phenol formaldehyde novolac resin, m-cresol formaldehyde novolac resin, phenol-m-cresol-formaldehyde co-polycondensed resin, phenol-p-cresol-formaldehyde co-polycondensed resin, m-cresol-p-cresol-formaldehyde co-polycondensed resin, o-cresol-p-cresol-formaldehyde co-polycondensed resin, phenol-o-cresol-m-cresol-formaldehyde co-polycondensed resin, phenol-o-cresol-p-cresol-formaldehyde co-polycondensed resin, phenol-m-cresol-p-cresol-formaldehyde co-polycondensed resin and the like.

On the other hand, as the monomer for obtaining the copolymer (2), there can be included N-(4-hydroxyphenyl)-(meth)acrylamide, N-(2-hydroxyphenyl)-(meth)acrylamide, N-(4-hydroxynaphthyl)-(meth)acrylamide, o-, m-, or p-hydroxyphenyl (meth)acrylate, o-, m- or p-hydroxystyrene, hydroxyethyl (meth) acrylate, hydroxypropyl (meth)-acrylate, (meth)acrylic acid, and by copolymerizing other known monomers with this monomer, a desired binder can be obtained. The binder in this case should preferably have a weight average molecular weight of 1,000 to 50,000, particularly 1,000 to 30,000.

Molecular weight of the above resin is measured according to the GPC (gel permeation chromatography) method. Calculations of number average molecular weight Mn and weight average molecular weight Mw are conducted by the method described in Morio Tsuge, Tatsuya Miyabayashi, Masayuki Tanaka, "Journal of Chemical Society of Japan" p. 800–805 (1972), namely the method in which the peaks in the oligomer region are uniformized (centers of the mountain and the valley of peaks are connected).

Also, in the above novolac resin, as the method for confirming the quantitative ratio of different phenols used for its synthesis, pyrolysis gas chromatography (PGC) is used. As to pyrolysis gas chromatography, its principle, apparatus and experimental conditions are described in, for example, "New Experimental Course", vol. 19, Polymeric Chemistry [I], edited by Shin Tsuge, p. 474–485 (published by Maruzen, 1978), etc. and the qualitative analytical method of novolac resin by pyrolysis gas chromatography follows the method described in Morio Tsuge, Takashi Tanaka and Masayuki Tanaka "Analytical Chemistry" vol. 18, p. 47–52 (1969).

Further, as the binder (3) when constituting the upper layer in Table 1, one comprising a heat-fusible polymer, having water permeability and water insolubility may be also used.

Shortly speaking, during development, it is preferable to use a binder which can permit well permeation of a developer to enable development of the photosensitive layer and is also insoluble in the developer.

Its specific example may be a water-dispersible emulsion.

For example, there may be included single component polymers or copolymers of acrylic and methacrylic acid esters such as methyl ester, ethyl ester, butyl ester, isobutyl ester, hexyl ester, decyl ester, lauryl ester, stearyl ester and cyclohexyl ester; vinyl esters such as vinyl acetate, vinyl propionate, vinyl isononanate, vinyl benzathate, ethylene, dibutylmaleinate, styrol, vinyl chloride, vinyl isobutyl ether, isobutylene, butadiene, paraffin, vinyl acetate, or vinyl butyral.

Such polymer dispersions are commercially available or can be prepared based on known methods.

Preferably, those having 1 to 50% by weight of a water-soluble polymer such as polyvinyl alcohol, etc. added in the above water-dispersible emulsion may be used.

Otherwise, it is also possible to use blends of alcohol-soluble nylon with water- or alkaline water-soluble polymer such as blend of alcohol-soluble nylon with water-soluble nylon, blend of phenol resin with alcohol-soluble nylon, blend of hydroxypropylmethyl cellulose phthalate with alcohol-soluble nylon, etc.

However, when the upper layer is a photosensitive layer or a colorant-photosensitive layer, only the binder of (3) cannot be used, but in this case the binder of (3) can be used by adding into (1) and/or (2).

In the above respective layers, in addition to the materials as described above, further plasticizers, coating characteristic enhancers, etc. can be also added.

Examples of plasticizers may include respective low molecular weight compounds, such as, phthalates, triphenyl phosphates, maleates, while examples of coating characteristic enhancers may include surfactants, such as fluorine type surfactants, nonionic surfactants, typically ethylcellulose polyalkylene ether, etc.

For preparation of the image forming material according to the present invention, the layer constituent materials as described above may be dissolved in an appropriate solvent, and coated successively or at the same time on a support subjected to mold release treatment or having the subbing layer as described above.

As the solvent, there may be employed water, methanol, ethanol, acetone, ethyl acetate, methyl cellosolve, ethyl cellosolve, dioxane, methyl ethyl ketone, cyclohexanone, diethylene glycol monomethyl ether, γ-butyrolactone, tetrahydrofuran, methylene chloride, ethylene chloride, dimethyl sulfoxide, dimethylformamide, etc., which can be used either singly or as a combination of two or more compounds.

The image forming material according to the present invention thus prepared is first subjected to imagewise exposure with an active ray.

For imagewise exposure, various light sources such as ultra-high pressure mercury lamp, tungsten lamp, mercury lamp, xenon lamp, fluorescent lamp, CRT light source, laser light source, etc. may be used.

The image forming material thus subjected to imagewise exposure forms an image with an aqueous developer which permeates through the upper layer (adhesive layer), and does not dissolve the image of the photosensitive layer and can dissolve or lubricate the non-image portion.

Next, the colored image obtained is transferred onto a white paper such as white papers for printing, including art paper, coated paper, pure paper, synthetic paper, etc. Specifically, the colored image is superposed on the white paper and passed through a laminator under heating and pressurization. The colored image is adhered to the white paper to be transferred thereon by the heating and pressurization during passage.

When a multi-color correction sheet is to be prepared, the above steps of exposure, developing and transfer are repeated for the necessary number of colors.

The multi-color correction sheet obtained has only the colored images transferred on the white paper, which is remarkably approximate to a printed matter.

The present invention is described below by referring to Examples, by which the present invention is not limited at all.

EXAMPLE 1

Four colors of coloration photosensitive dispersions with the composition shown below were prepared and applied on a polyethyleneterephthalate film subjected to mold release treatment (trade name: Tuftop, produced by Toray K.K.) to a dried film thickness of 2 μm.

Photosensitive resin having the following structure (average molecular weight: 800), 1.15 g:

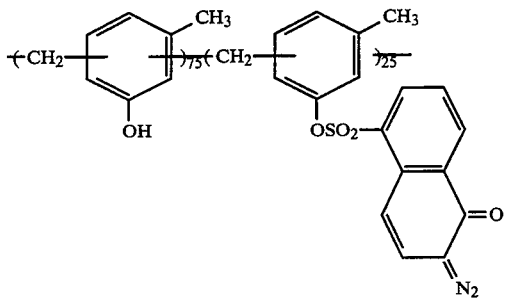

Phenol resin having the following structure (average molecular weight 2,000); 3.85 g:

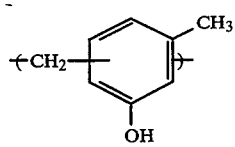

Pigments shown below; 1.5 g
Methyl cellosolve; 25 g
Methyl ethyl ketone; 25 g
(Pigments)
 Black: Carbon black #50 (produced by Mitsubishi Kasei K.K.);
 Yellow: Chromophthalyellow 8G (produced by Ciba-Geigy Co.);
 Magenta: Chromphthalred A (″);
 Cyan: Chromphthalblue 4 GN (″).

Next, as the adhesive layer, the emulsion shown below was applied on the coloration photosensitive layer to a dried film thickness of 1 μm.

| | |
|---|---|
| Ethylene-vinyl acetate copolymer emulsion [trade name: OM-28 (containing 10% PVA), produced by Kuraray K.K.] | 5 g |
| Water | 50 g |

Then, in order to enhance adhesion between the coloration photosensitive layer and the adhesive layer, aging was effected at 55° C. for 24 hours.

The image forming materials of the four colors obtained were each superposed on the color resolving positive-mask of each color and subjected to imagewise exposure from the polyethyleneterephthalate film side at a distance of 50 cm from a 3 KW metal halide lamp and then dipped in a 10-fold diluted solution of SDP-1 (Sakura PS plate developer: produced by Konishiroku Photo Industry) for 60 seconds, followd by developing with cellulose sponge, to obtain colored images of four colors.

The yellow color image previously obtained was adhered to an art paper and passed through a pair of nip rolls heated to 100° C. to have the color image transferred onto the art paper. Subsequently, in the order of magenta, cyan and black, color images were transferred to obtain a color proofing sheet comprising four colors on the art paper.

The color proof obtained was found to have only images transferred directly onto the art paper, and remarkably approximate to a printed matter.

EXAMPLE 2

A support having a mold releasable surface was prepared by applying a coating solution for subbing layer with a composition shown below on a polyethyleneterephthalate film:

| | |
|---|---|
| Alcohol-soluble nylon (trade name: Ultramid 1c, produced by BASF Co.) | 2 g |
| Hydroxystyrene (trade name: Resin M, produced by Maruzen Sekiyu Co.) | 2 g |
| Methanol | 40 g |
| Methylcellosolve | 10 g |

Next, four colors of coloration photosensitive layer dispersions with the composition shown below were prepared and applied to a dry film thickenss of 2 μm.

| | |
|---|---|
| Pentaerythritol tetraacrylate | 43.2 g |
| Copolymer of benzyl methacrylate and methacrylic acid (BMA/MA = 73/27 molar ratio) | 60 g |
| Micheler's ketone | 0.41 g |
| Benzophenone | 2.54 g |
| P-methoxyphenol | 0.12 g |
| Pigment (the same as in Example 1) | 30 g |
| Methyl cellosolve | 1,000 g |

Next, as the adhesive layer, a coating solution with the following composition was applied on the coloration photosensitive layer to a dried film thickness of 1 μm.

| | |
|---|---|
| Alcohol-soluble nylon (trade name: CM-8000, Produced by Toray K.K.) | 2 g |
| Water-soluble nylon (trade name: A-70, produced by Toray K.K.) | 2 g |
| Methanol | 35 g |
| Water | 15 g |

Then, in order to enhance adhesion between the coloration photosensitive layer and the adhesive binder layer, aging was effected at 55° C. for 24 hours.

The image forming materials of four colors obtained were subjected to imagewise exposure from the film surface by use of a color-resolving negative-mask similarly as in Example 1, then dipped in a 3-fold diluted solution of SDN-21 (Sakura PS plate developer: produced by Konishiroku Photo Industry) for 60 seconds, followed by development with a cellulose sponge, to obtain colored images of four colors.

The colored images obtained were adhered to an art paper and passed through the nip rolls heated to 100° C. similarly as in Example 1 to obtain a color proofing sheet comprising four colors on the art paper.

The color proof obtained was found to have only images transferred directly onto the art paper, and remarkably approximate to a printed matter.

EXAMPLE 3

The positive-type photosensitive composition used in Example 1 (the composition in which no pigment was added in the coloration photosensitive layer dispersion in Example 1) was applied on a polyethyleneterephthalate film to a dried film thickness of 2 μm.

Next, a pigment was added and dispersed in the following emulsion and applied as the coloration adhesive layer to a dried film thickness of 2 μm.

| | |
|---|---|
| Paraffin wax emulsion (solids: 30%) | 20 g |
| Pigment in Example 1 | 1.2 g |
| Polyvinyl alcohol (trade name: PVA-117, produced by Kuraray K.K.) | 0.3 g |
| Water | 3 g |

By use of the image forming materials of four colors obtained, a color proofing sheet comprising four colors was obtained in the same manner as in Example 1.

The color images of four colors obtained were passed through a pair of nip rolls heated to 100° C. in the order of yellow, magenta, cyan and black to effect transfer of the color images onto an art paper to obtain a color proofing sheet.

During this operation, only the colored adhesive layer was transferred onto the art paper, with the photosensitive layer remaining on the polyethyleneterephthalate film.

The color proof obtained was found to have only images transferred directly onto the art paper, and remarkably approximate to a printed matter.

EXAMPLE 4

Four colors of coloration photosensitive dispersions with the composition shown below were prepared and applied on a polymethyleneterephthalate film subjected to mold release treatment (trade name: Tuftop, produced by Toray K.K.) to a dried film thickness of 2 μm.

Photosensitive resin having the following structure (A):

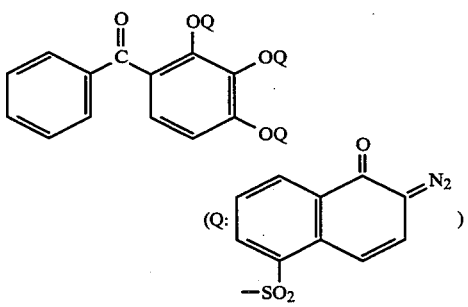

Novolac resin having the following structure (average molecular weight 2,000) (B):

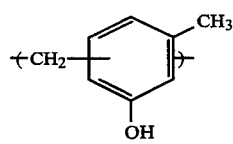

Ethyl cellosolve (EC)

| Preparation table (unit: parts by weight) | | | | |
|---|---|---|---|---|
| | Black | Cyan | Magenta | Yellow |
| (A) | 1.15 | 1.15 | 1.15 | 1.15 |
| (B) | 3.85 | 3.85 | 3.85 | 3.85 |
| (EC) | 42.8 | 39.6 | 40.6 | 40.6 |
| (Pigment) | | | | |
| Carbon black #50 (produced by Mitsubishi Kasei K.K.) | 0.50 | — | — | — |
| Chromphthalblue 4GN (produced by Ciba-Geigy Co.) | — | 0.28 | — | — |
| Chromphthalred A (produced by Ciba-Geigy Co.) | — | — | 0.34 | — |
| Chromophthalyellow 8G (produced by Ciba-Geigy Co.) | — | — | — | 0.34 |

Hereinafter, unit of the components is represented by parts by weight unless otherwise specified.

Next, four colors of coloration adhesive layer dispersions with the compositions shown below were prepared and applied on the coloration photosensitive layer of the same color to a dried film thickness of 1 μm.

| Preparation table (unit: parts by weight) | | | | |
|---|---|---|---|---|
| | Black | Cyan | Magenta | Yellow |
| (Adhesive) | | | | |
| Vinyl acetate emulsion (trade name: Saibinol A, produced by Saiden Kagaku Kagaku K.K.) | 5 | 5 | 5 | 5 |
| Water | 50 | 50 | 50 | 50 |
| (Pigment) | | | | |
| Carbon black #50 (produced by Mitsubishi Kasei K.K.) | 0.49 | — | — | — |
| Chromphthalblue 4GN (produced by Ciba-Geigy Co.) | — | 0.27 | — | — |
| Chromphthalred A (produced by Ciba-Geigy Co.) | — | — | 0.34 | — |
| Chromophthalyellow 8G (produced by Ciba-Geigy Co.) | — | — | — | 0.34 |

Then, in order to enhance adhesion between the coloration photosensitive layer and the coloration adhesive layer, aging was effected at 55° C. for 24 hours.

By use of the image forming materials of four colors obtained, color images of four colors were obtained in the same manner as in Example 1.

The color images of four colors obtained were passed through a pair of nip rolls heated to 100° C. in the order of yellow, magenta, cyan and black to effect transfer of the color images onto an art paper to obtain a color proofing sheet.

The color proof obtained was found to have only images transferred directly onto the art paper, and remarkably approximate to a printed matter.

EXAMPLE 5

A support subjected to mold release treatment was prepared by laminating a polypropylene film with a thickness of 25 μm (trade name "S:#25", produced by Tokyo Cellophane Paper K.K.) through a polyurethane resin type adhesive on a polyethyleneterephthalate film with a thickness of 50 μm (Trade name: Lumilar T type, produced by Toray K.K.).

Next, the colorant layer dispersions of four colors with the folowing compositions were applied on the support subjected to mold release treatment to a dried film thickness of 1 μm.

Preparation table (unit: parts by weight)

| | Black | Cyan | Magenta | Yellow |
|---|---|---|---|---|
| (Binder) | | | | |
| Novolac resin having the following structure: (average molecular weight: 2,000) | 5 | 5 | 5 | 5 |
| Ethyl cellosolve (EC) | 42.8 | 39.6 | 40.6 | 40.6 |
| (Pigment) | | | | |
| Carbon black #50 (produced by Mitsubishi Kasei K.K.) | 0.99 | — | — | — |
| Chromphthalblue 4GN (produced by Ciba-Geigy Co.) | — | 0.55 | — | — |
| Chromphthalred A (produced by Ciba-Geigy Co.) | — | — | 0.68 | — |
| Chromophthalyellow 8G (produced by Ciba-Geigy Co.) | — | — | — | 0.68 |

$$\mathrm{-(CH_2-\underset{OH}{\underset{|}{\bigcirc}}-)-}\quad CH_3$$

Further, a positive-type photosensitive adhesive solution with the following composition was applied on the colorant layers of the respective colors to a dried film thickness of 1 μm.

Binder (4-hydroxyphenylmethacrylamide:

| Binder (4-hydroxyphenylmethacrylamide: acrylonitrile:methyl methacrylate:acrylic acid = 15:10:71:4 (mol %), weight average molecular weight Mw = 2,000) | 3.85 parts |
|---|---|
| Photosensitive material (1,2-naphthoquinone-2-diazide-5-sulfonic acid ester of 2,3,4-tri-hydroxybenzophenone) | 1.15 parts |
| Methyl cellosolve (MC) | 39.6 parts |

By use of the image forming materials of four colors obtained, color images of four colors were obtained in the same manner as in Example 1.

The color images of four colors obtained were passed through a pair of nip rolls heated to 100° C. in the order of yellow, magenta, cyan and black to effect transfer of the color images onto an art paper to obtain a color proofing sheet.

The color proof obtained was found to have only images transferred directly onto the art paper, and remarkably approximate to a printed matter.

EXAMPLE 6

A color proof was prepared in the same manner as in Example 5 except for using the photosensitive colorant layer dispersions with the following compositions in place of the colorant layer dispersions.

Preparation table (unit: parts by weight)

| | Black | Cyan | Magenta | Yellow |
|---|---|---|---|---|
| (Binder) | | | | |
| Novolac resin having the following structure: (average molecular weight: 2,000) | 3.85 | 3.85 | 3.85 | 3.85 |

$$\mathrm{-(CH_2-\underset{OH}{\underset{|}{\bigcirc}}-)-}\quad CH_3$$

| | Black | Cyan | Magenta | Yellow |
|---|---|---|---|---|
| (Photosensitive material) | | | | |
| (1,2-naphthoquinone-2-diazide 5-sulfonic acid ester of 2,3,4-trihydroxybenzophenone) | 1.15 | 1.15 | 1.15 | 1.15 |
| Ethyl cellosolve (EC) | 42.8 | 39.6 | 40.6 | 40.6 |
| (Pigment) | | | | |
| Carbon black #50 (produced by Mitsubishi Kasei K.K.) | 0.99 | — | — | — |
| Chromphthalblue 4GN (produced by Ciba-Geigy Co.) | — | 0.55 | — | — |
| Chromphthalred A (produced by Ciba-Geigy Co.) | — | — | 0.68 | — |
| Chromophthalyellow 8G (produced by Ciba-Geigy Co.) | — | — | — | 0.68 |

The color proof obtained was found to have only images transferred directly onto the art paper, and remarkably approximate to a printed matter.

EXAMPLE 7

In the same manner as in Example 5, a support subjected to mold release treatment was prepared.

Next, the colorant layer dispersions of four colors with the following compositions were applied on the support subjected to mold release treatment to a dried film thickness of 1 μm.

Preparation table (unit: parts by weight)

| | Black | Cyan | Magenta | Yellow |
|---|---|---|---|---|
| (Binder) | | | | |
| 4-Hydroxyphenylmethacryl amide:acrylonitrile:methyl methacrylate:acrylic acid = 10:10:77:3; weight average molecular weight (Mw): 18,000 | 5 | 5 | 5 | 5 |
| Ethyl cellosolve (EC) | 42.8 | 39.6 | 40.6 | 40.6 |
| (Pigment) | | | | |
| Carbon black #50 (produced by Mitsubishi Kasei K.K.) | 0.99 | — | — | — |
| Chromphthalblue 4GN (produced by Ciba-Geigy Co.) | — | 0.55 | — | — |
| Chromphthalred A (produced by Ciba-Geigy Co.) | — | — | 0.68 | — |
| Chromophthalyellow 8G (produced by Ciba-Geigy Co.) | — | — | — | 0.68 |

Further, a positive-type photosensitive adhesive solution with the following composition was applied on the colorant layers of the respective colors onto a dried film thickness of 1 μm.

| Binder (phenol resin with weight average molecular weight Mw = 1,000) | 3.85 parts |
|---|---|
| Photosensitive material (1,2-naphthoquinone-2-diazide-5-sulfonic acid ester of 2,3,4-tri-hydroxybenzophenone) | 1.15 parts |

| | |
|---|---|
| -continued | |
| Methyl cellosolve (MC) | 39.6 parts |

By use of the image forming materials of four colors obtained, color images of four colors were obtained in the same manner as in Example 1.

The color images of four colors obtained were passed through a pair of nip rolls heated to 100° C. in the order of yellow, magenta, cyan and black to effect transfer of the color images onto an art paper to obtain a color proofing sheet.

The color proof obtained was found to have only images transferred directly onto the art paper, and remarkably approximate to a printed matter.

EXAMPLE 8

A color proof was prepared in the same manner as in Example 7 except for using the photosensitive colorant layer dispersions with the following compositions in place of the colorant layer dispersions.

| Preparation table (unit: parts by weight) | | | | |
|---|---|---|---|---|
| | Black | Cyan | Magenta | Yellow |
| (Binder) | | | | |
| 4-Hydroxyphenylmethacryl amide:acrylonitrile:methyl methacrylate:acrylic acid = 10:10:77:3; weight average molecular weight (Mw): 18,000 | 3.85 | 3.85 | 3.85 | 3.85 |
| (Photosensitive material) | | | | |
| (1,2-naphthoquinone-2-diazide 5-sulfonic acid ester of 2,3,4-trihydroxybenzo-phenone) | 1.15 | 1.15 | 1.15 | 1.15 |
| Ethyl cellosolve (EC) | 42.8 | 39.6 | 40.6 | 40.6 |
| (Pigment) | | | | |
| Carbon black #50 (produced by Mitsubishi Kasei K.K.) | 0.99 | — | — | — |
| Chromphthalblue 4GN (produced by Ciba-Geigy Co.) | — | 0.55 | — | — |
| Chromphthalred A (produced by Ciba-Geigy Co.) | — | — | 0.68 | — |
| Chromophthalyellow 8G (produced by Ciba-Geigy Co.) | — | — | — | 0.68 |

The color proof obtained was found to have only images transferred directly onto the art paper, and remarkably approximate to a printed matter.

EXAMPLE 9

In the same manner as in Example 5, a support subjected to mold release treatment was prepared.

Next, a binder solution with the following composition was applied on the support subjected to mold release treatment to a dried film thickness of 1 μm.

Phenol resin having the following structure:

(weight average molecular weight: 1,000)    5 parts

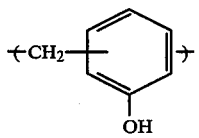

Ethyl cellosolve (EC)    45 parts

Next, the positive-type photosensitive colorant layer dispersions of four colors with the following compositions were applied on the binder layer to a dried film thickness of 1 μm.

| Preparation table (unit: parts by weight) | | | | |
|---|---|---|---|---|
| | Black | Cyan | Magenta | Yellow |
| (Binder) | | | | |
| 4-Hydroxyphenylmethacryl amide:acrylonitrile:methyl methacrylate:acrylic acid = 10:10:77:3; weight average molecular weight (Mw): 18,000) | 3.85 | 3.85 | 3.85 | 3.85 |
| (Photosensitive material) | | | | |
| (1,2-naphthoquinone-2-diazide-5-sulfonic acid ester of 2,3,4-trihydroxybenzo-phenone) | 1.15 | 1.15 | 1.15 | 1.15 |
| Ethyl cellosolve (EC) | 42.8 | 39.6 | 40.6 | 40.6 |
| (Pigment) | | | | |
| Carbon black #50 (produced by Mitsubishi Kasei K.K.) | 0.99 | — | — | — |
| Chromphthalblue 4GN (produced by Ciba-Geigy Co.) | — | 0.55 | — | — |
| Chromphthalred A (produced by Ciba-Geigy Co.) | — | — | 0.68 | — |
| Chromophthalyellow 8G (produced by Ciba-Geigy Co.) | — | — | — | 0.68 |

By use of the image forming materials of four colors obtained, color images of four colors were obtained in the same manner as in Example 1.

The color images of four colors obtained were passed through a pair of nip rolls heated to 100° C. in the order of yellow, magenta, cyan and black to effect transfer of the color images onto an art paper to obtain a color proofing sheet.

The color proof obtained was found to have only images transferred directly onto the art paper, and remarkably approximate to a printed matter.

EXAMPLE 10

In the same manner as in Example 5, colorant layer dispersions of four colors were applied on the support subjected to mold release treatment to a dried film thickness of 0.5 μm.

Next, the photosensitive colorlant layer dispersions used in Example 9 were applied on the colorant layers of the same color to a dried film thickness of 0.5 μm.

By use of the image forming materials of four colors obtained, a color proofing sheet comprising four colors was obtained in the same manner as in Example 1.

The color proof obtained was found to have only images transferred directly onto the art paper, and remarkably approximate to a printed matter.

EXAMPLE 11

In the same manner as in Example 5, a support subjected to mold release treatment was prepared.

Next, a positive-type photosensitive composition with the following composition was applied on the support subjected to mold release treatment to a dried film thickness of 1 μm.

Phenol resin having the following structure:

(weight average molecular weight: 1,000)    3.85 parts

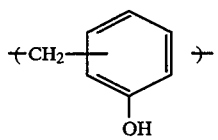

| | |
|---|---|
| (1,2-naphthoquinone-2-diazide-5-sulfonic acid ester of 2,3,4-trihydroxybenzophenone) | 1.15 parts |
| Ethyl cellosolve (EC) | 39.6 parts |

Next, the photosensitive colorlant layer dispersions used in Example 9 were applied on the photosensitive composition to a dried film thickness of 1 μm.

By use of the image forming materials of four colors obtained, a color proofing sheet comprising four colors was obtained in the same manner as in Example 1.

The color proof obtained was found to have only images transferred directly onto the art paper, and remarkably approximate to a printed matter.

EXAMPLE 12

In the same manner as in Example 5, a support subjected to mold release treatment was prepared.

Next, the photosensitive colorant layer dispersions of four colors used in Example 6 were applied to a dried film thickness of 0.5 μm.

Next, the photosensitive colorlant layer dispersions of four colors used in Example 9 were applied on the photosensitive colorant layers of the same color to a dried film thickness of 0.5 μm.

By use of the image forming materials of four colors obtained, a color proofing sheet comprising four colors were obtained in the same manner as in Example 1.

The color proof obtained was found to have only images transferred directly onto the art paper, and remarkably approximate to a printed matter.

EXAMPLE 13

On a support subjected to mold release treatment prepared in the same manner as in Example 5, negative-type photosensitive colorant layer dispersions of four colors having the following compositions were applied to a dried film thickness of 1 μm.

Preparation table (unit: parts by weight)

| | Black | Cyan | Magenta | Yellow |
|---|---|---|---|---|
| Diazo resin having the following structural formula: [weight average molecular weight (Mw): about 1,000] | 1 | 1 | 1 | 1 |

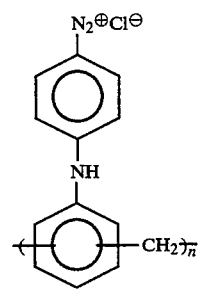

| | | | | |
|---|---|---|---|---|
| 4-Hydroxyphenylmethacryl amide:acrylonitrile:methyl methacrylate:acrylic acid = 10:10:77:3, weight average molecular weight (Mw): 18,000 | 5 | 5 | 5 | 5 |
| Polyacrylic acid (trade name: (Jucs-AC10C, produced by Nippon Junyaku K.K.) | 0.3 | 0.3 | 0.3 | 0.3 |
| Methyl cellosolve (EC) (Pigment) | 51.4 | 47.5 | 48.7 | 48.7 |
| Carbon black #50 (produced by Mitsubisbi Kasei K.K.) | 1.19 | — | — | — |
| Chromphthalblue 4GN (produced by Ciba-Geigy Co.) | — | 0.66 | — | — |
| Chromphthalred A (produced by Ciba-Geigy Co.) | — | — | 0.82 | — |
| Chromophthalyellow 8G (produced by Ciba-Geigy Co.) | — | — | — | 0.82 |

Next, negative-type photosensitive adhesive solutions with the following compositions were applied on the photosensitive colorant layers of the respective colors to a dried film thickness of 1 μm.

Diazo resin: 1 part

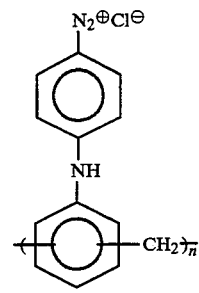

(weight average molecular weight (Mw): about 1,000)

| Binder | |
|---|---|
| 4-Hydroxyphenylmethacrylamide: acrylonitrile:methyl methacrylate: acrylic acid = 15:10:71:4 (mol %); weight average molecular weight (Mw) 2,000 | 5 parts |
| Ethyl cellosolve | 47.5 parts |

The coloration image forming material thus obtained was exposed to a 1 KW metal halide light source from the polyethyleneterephthalate film side for 10 minutes, and then developed for one minute in a developer obtained by dissolving sodium carbonate in one liter of water at 25° C. and adjusting the pH to 9, whereby developing could be done with a low alkaline developer to give a a good image. Thus, color images of four colors were obtained.

The color images obtained were adhered onto an art paper and were passed through a pair of nip rolls heated to 100° C. in the same manner as in Example 1 to obtain a color proofing sheet comprising 4 colors on the art paper.

The color proof obtained was found to have only images transferred directly onto the art paper, and remarkably approximate to a printed matter.

EXAMPLE 14

On a support subjected to mold release treatment prepared in the same manner as in Example 5, the photosensitive colorant layer dispersions of four colors used in Example 8 were applied to a dried film thickness of 1 μm.

Next, the positive-type photosensitive adhesive solutions used in Example 5 were applied on the photosensitive colorant layers of the respective colors to a dried film thickness of 1 μm.

By use of the image forming materials of four colors thus obtained, color images of four colors were obtained in the same manner as in Example 13.

The color images obtained were adhered onto an art paper and were passed through a pair of nip rolls heated to 100° C. in the same manner as in Example 1 to obtain a color proofing sheet comprising 4 colors on the art paper.

The color proof obtained was found to have only images transferred directly onto the art paper, and remarkably approximate to a printed matter.

COMPARATIVE EXAMPLE 1

A color proofing sheet was prepared in the same manner as in Example 4 in Japanese Unexamined Patent Publication No. 41830/1972.

A specific example is shown below.

An ethyl acetate solution of a copolymer of vinyl chloride and vinyl acetate was coated on a polyester film and then dried to prepare a color image backing layer, followed by coating and drying of a solution with a composition:

| | |
|---|---|
| O-naphthoquinonediazide sulfonic acid ester | 2 g |
| Phenol formaldehyde novolac | 1 g |
| Oil yellow 5G (oily dye) | 0.5 g |
| Acetone | 40 g |
| Methyl cellosolve | 60 g | to prepare a photosensitive heat transfer sheet for yellow.

By use of Zabon Fast Red BB, Zabon Fast Blue HFL and Oil Black HB in place of the oily dye Oil Yellow 5G, heat transfer sheets for magenta, cyan and black were prepared similarly.

The heat transfer sheets of the respective colors were adhered to the corresponding color resolving net positives, respectively, exposed to xenon arc lamp, dipped in an alkaline developer to remove the photosensitive layers at the exposed portions, washed with water and dried to obtain the respective color images. The color image formed heat transfer sheet was superposed on a coated paper and pressed by passing between a metal roller heated to 100° C. and a rubber roller contacted therewith, followed by peel-off of the polyester film. As the result, the color image was transferred together with the color image backing layer onto the coated paper surface. By repeating this procedure similarly for the respective color image sheets, a multi-color image was obtained.

The color proofing sheet obtained, which was wholly covered with the color image backing layer, was found to be as shown in the photograph. For making the transferred image approximate to that of a printed matter, it is at least required to effect matting.

As described above, according to the present invention, the treating process becomes simpler and also a transferred image approximate to a printed matter can be obtained.

We claim:

1. A method for forming a color proof having a multicolor transfer image which comprises:
    (a) subjecting a colored image forming material to image-wise exposure with an active ray, wherein said colored image forming material has a support, an outermost layer and an inner layer thereon, a photosensitive material being contained in said outermost layer or said inner layer, said outermost layer being adherable to an image receiving member, free of colorant and containing an adhesive, and said inner layer comprising a colorant;
    (b) subjecting said colored image forming material to aqueous development thereby leaving only said outermost layer and said inner layer corresponding to a first colored image on the support;
    (c) transferring the first colored image to said image receiving member by peel-off of the support by applying heat and pressure so that said outermost layer adheres to said image receiving member; and
    (d) transferring at least one second colored image with a hue different from the hue of said first colored image onto said image receiving member having said first colored image, whereby the surface of said image receiving member is left exposed at non-image portions of said multi-color image.

2. The color proof forming method according to claim 1, wherein said photosensitive material is at least one selected from the group consisting of a photocrosslinkable type photosensitive resin system; a system comprising a mixture of a diazonium salt or its condensate with a binder; a system in which an aromatic azide compound is used as the photocrosslinkable agent and mixed with a binder; a photosensitive resin utilizing photoradical polymerization or photoionic polymerization; and a photosolubilizing type resin system.

3. The color proof forming method according to claim 1, wherein the photosensitive material is quinonediazide compounds.

4. The color proof forming method according to claim 3, wherein the photosensitive material is compounds obtained by condensation of 1,2-benzoquinonediazide-4-sulfonyl chloride, 1,2-naphthoquinonediazide-4-sulfonyl chloride, 1,2-naphthoquinonediazide-6-sulfonyl chloride or 1,2-naphthoquinonediazide-6-sulfonyl chloride with hydroxyl group- and/or amino group-containing compounds.

5. The color proof forming method according to claim 4, wherein said hydroxyl group-containing compound is trihydroxybenzopheone, dihydroxyanthraquinone, Bisphenol A, phenol novolac resin, resorcin benzaldehyde condensed resin or pyrogallol acetone condensed resin, and said amino group-containing compound is aniline, p-aminodiphenylamine, p-aminobenzophenone, 4,4'-diaminodiphenylamine or 4,4-diaminobenzophenone.

6. The color proof forming method according to claim 1, wherein said colored image forming material further contains a binder.

7. The color proof forming method according to claim 6, wherein said binder is a polymeric compound which can form a film and is soluble in a solvent, and can be dissolved or swelled in the developer.

8. The color proof forming method according to claim 7, wherein said binder is at least one of acrylic acid or methacrylic acid and alkyl ester or sulfoalkylester thereof; phenol resin; polyvinyl butyral; polyacrylamide; cellulose derivatives; polystyrene, polyvinyl chloride, chlorinated rubber, polyisobutylene, polybutadiene and polyvinyl acetate and their copolymers; cellulose acetate; cellulose propionate; and cellulose acetate phthalate.

9. The color proof forming method according to claim 7, wherein the binder is present in the outermost layer and is (1) a novolac resin having a weight average molecular weight (Mw) of 3,500 to 500 and a number average molecular weight (Mn) of 1,000 to 200; (2) a copolymer containing at least one of a phenolic hydroxyl group, an alcoholic hydroxyl group and a carboxylic group; or (3) compounds comprising a heat-fusible polymer, having water permeability and water insolubility.

10. The color proof forming method according to claim 9, wherein said novolac resin is a phenol resin.

11. The color proof forming method according to claim 6, wherein said binder comprises a heat-fusible polymer, having water permeability and water insolubility.

12. The color proof forming method according to claim 11, wherein said binder is a water-dispersible emulsion.

13. The color proof forming method according to claim 12, wherein said water-dispersible emulsion is single component polymers or copolymers of acrylic and methacrylic acid esters or vinyl esters.

14. The color proof forming method according to claim 13, wherein said water-dispersible emulsion is at least one of methyl ester, ethyl ester, butyl ester, isobutyl ester, hexyl ester, decyl ester, lauryl ester, stearyl ester, cyclohexyl ester, vinyl acetate, vinyl propionate, vinyl isononanate, vinyl benzathate, ethylene, dibutylmaleinate, styrol, vinyl chloride, vinyl isobutyl ether, isobutylene, butadiene, paraffin, vinyl acetate and vinyl butyral.

15. The color proof forming method according to claim 14, wherein said water-dispersible emulsion is added with a water-soluble polymer in an amount of 1 to 50% by weight.

16. The color proof forming method according to claim 1, wherein said support is a polyester film, an acetate film, a polyvinyl chloride film, a polystyrene film or a polypropylene film.

17. The color proof forming method according to claim 1, wherein said support is subjected to mold release treatment with an oil repellent substance or provided with a subbing layer.

18. The color proof forming method according to claim 17, wherein said oil repellent substance is silicone oil, fluorine resin, fluorine type surfactant, polyolefine or polyamide.

19. The color proof forming method according to claim 17, wherein said subbing layer is made of alcohol-soluble polyamide, alcohol-soluble nylon, a blend of a partially esterified resin of a copolymer of styrene and maleic anhydride with a methoxymethylated nylon, polyvinyl acetate, polyacrylate, a copolymer of vinyl chloride and vinyl acetate, polyvinyl butyrate, cellulose acetate phthalate, methyl cellulose, ethyl cellulose, cellulose diacelate, cellulose triacetate or polyvinyl alcohol.

20. The color proof forming method according to claim 1, wherein the outermost layer contains a binder and the inner layer contains the photosensitive material and the colorant.

21. The color proof forming method according to claim 1, wherein the outermost layer contains the photosensitive material and the inner layer contains said colorant.

22. The color proof forming method according to claim 1, wherein said outermost layer is transparent.

* * * * *